(12) United States Patent
Wolter et al.

(10) Patent No.: US 7,928,590 B2
(45) Date of Patent: Apr. 19, 2011

(54) INTEGRATED CIRCUIT PACKAGE WITH A HEAT DISSIPATION DEVICE

(75) Inventors: Andreas Wolter, Markt Schwaben (DE); Harry Hedler, Germering (DE); Matthias Georgi, Dresden (DE)

(73) Assignee: Qimonda AG, Munich (DE)

( * ) Notice: Subject to any disclaimer, the term of this patent is extended or adjusted under 35 U.S.C. 154(b) by 1148 days.

(21) Appl. No.: 11/464,784

(22) Filed: Aug. 15, 2006

(65) Prior Publication Data

US 2008/0042261 A1 Feb. 21, 2008

(51) Int. Cl.
*H01L 23/29* (2006.01)
(52) U.S. Cl. .......... 257/788; 257/686; 257/777; 257/795
(58) Field of Classification Search .................. 257/686, 257/777, 787–796
See application file for complete search history.

(56) References Cited

U.S. PATENT DOCUMENTS

| | | | |
|---|---|---|---|
| 5,239,199 A | | 8/1993 | Chiu |
| 5,316,080 A | | 5/1994 | Banks et al. |
| 5,589,714 A | * | 12/1996 | Howard .................. 257/788 |
| 5,815,372 A | * | 9/1998 | Gallas .................... 361/760 |
| 5,818,107 A | * | 10/1998 | Pierson et al. ............. 257/723 |
| 5,828,000 A | * | 10/1998 | Sano ....................... 174/548 |
| 5,925,924 A | * | 7/1999 | Cronin et al. ............. 257/622 |
| 6,087,718 A | | 7/2000 | Cho |
| 6,472,741 B1 | * | 10/2002 | Chen et al. ............... 257/712 |
| 6,577,013 B1 | | 6/2003 | Glenn et al. |
| 6,607,938 B2 | | 8/2003 | Kwon et al. |
| 6,781,849 B2 | * | 8/2004 | Baek et al. ................ 361/760 |
| 6,998,701 B2 | * | 2/2006 | Ochiai et al. ............. 257/666 |
| 2002/0109211 A1 | | 8/2002 | Shinohara |
| 2005/0104181 A1 | | 5/2005 | Lee et al. |
| 2005/0116336 A1 | | 6/2005 | Chopra et al. |
| 2007/0040266 A1 | | 2/2007 | Dusberg et al. |

FOREIGN PATENT DOCUMENTS

| | | |
|---|---|---|
| DE | 19747105 | 7/1998 |
| DE | 10149093 | 8/2002 |
| DE | 10345157 | 5/2005 |

* cited by examiner

*Primary Examiner* — Leonardo Andújar
(74) *Attorney, Agent, or Firm* — Patterson & Sheridan, LLP

(57) ABSTRACT

Integrated circuit assembly including a die stack assembly having a heat dissipation device thermally coupled to a lateral of surface the die stack assembly. The die stack assembly includes a plurality integrated circuits placed on each other. In another embodiment a heat dissipation device comprising an encapsulant is thermally coupled to and surrounds a die stack assembly that includes a plurality of integrated circuits placed on each other. At least one heat conducting intermediate layer between integrated circuits is thermally coupled to the heat dissipation device.

15 Claims, 8 Drawing Sheets

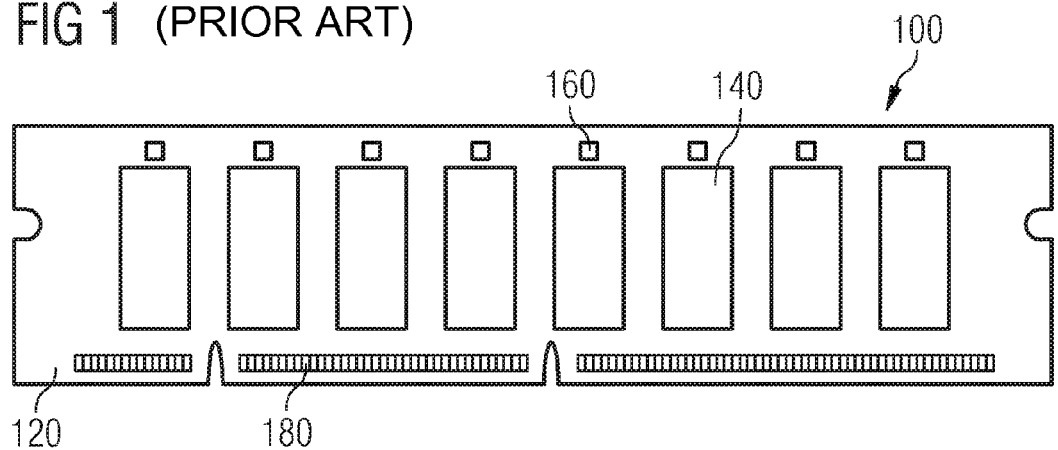
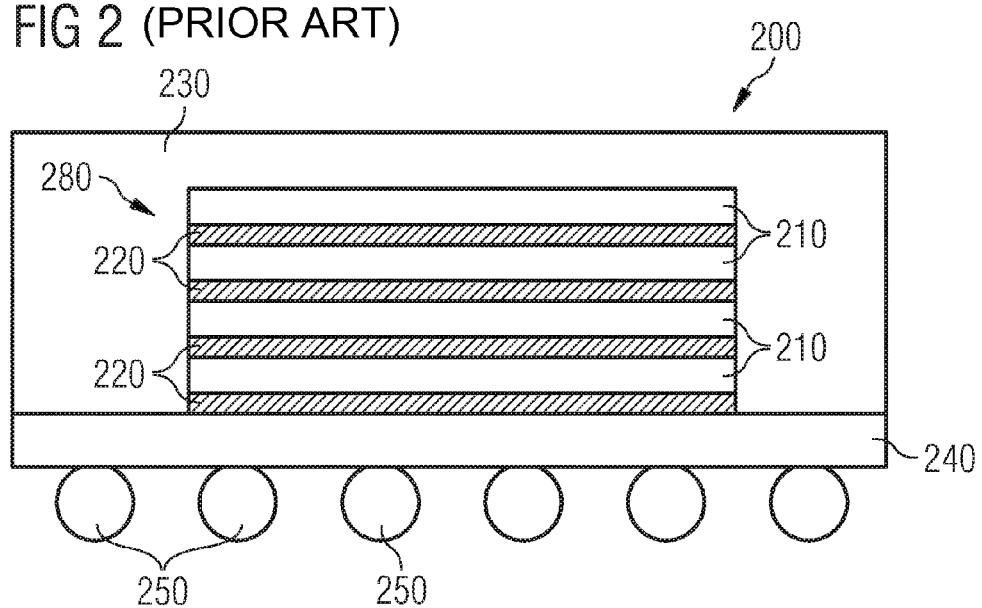

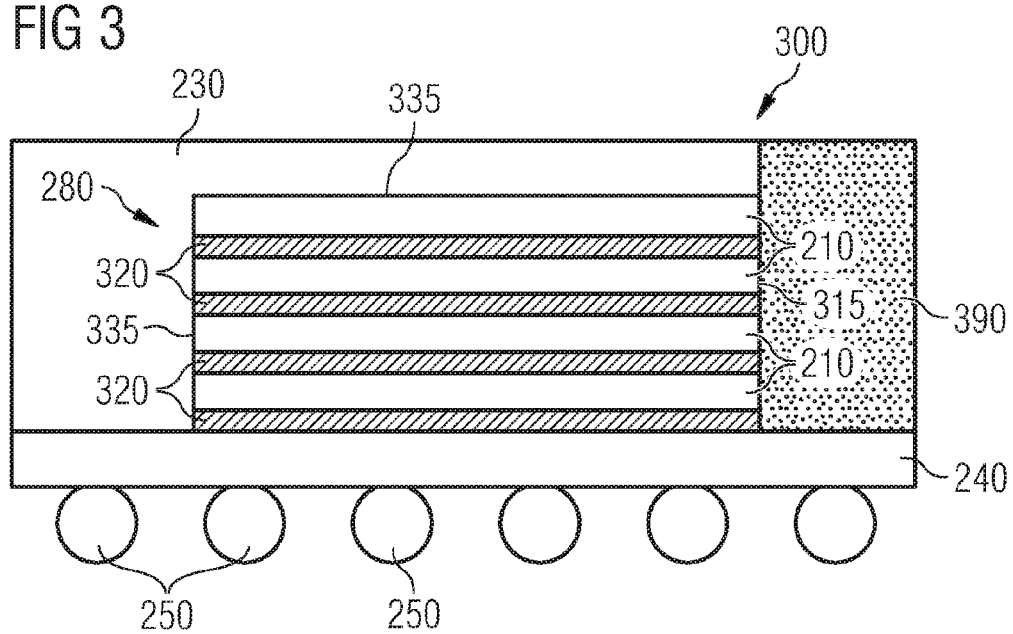
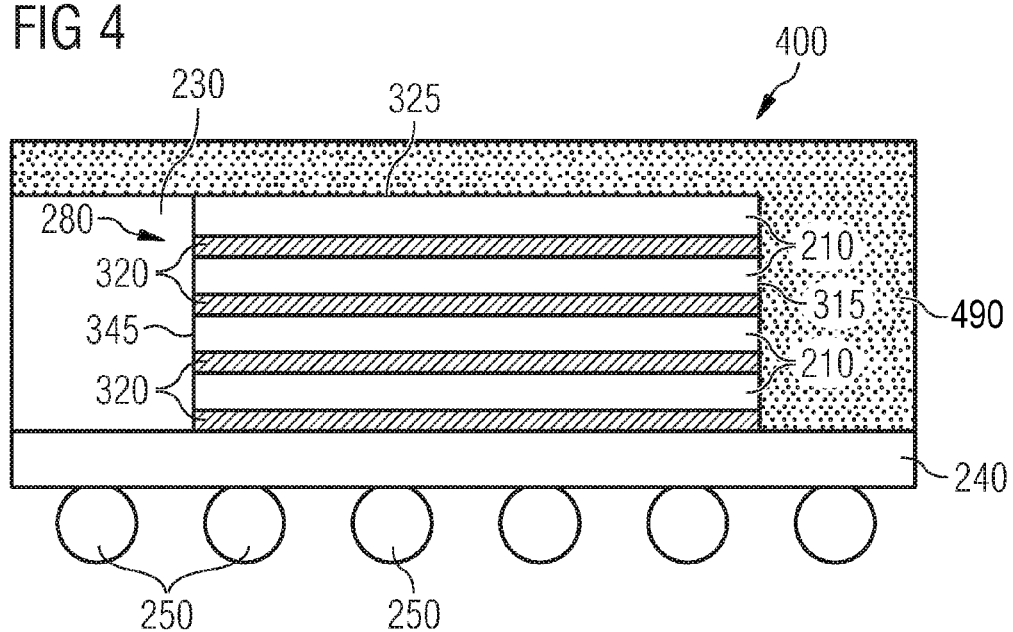

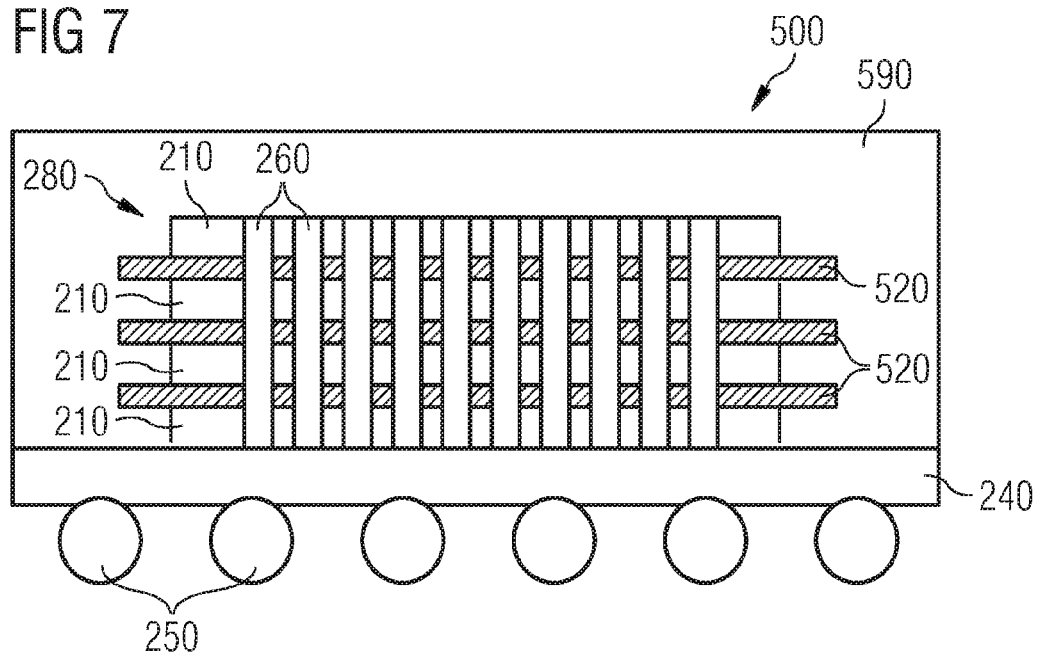
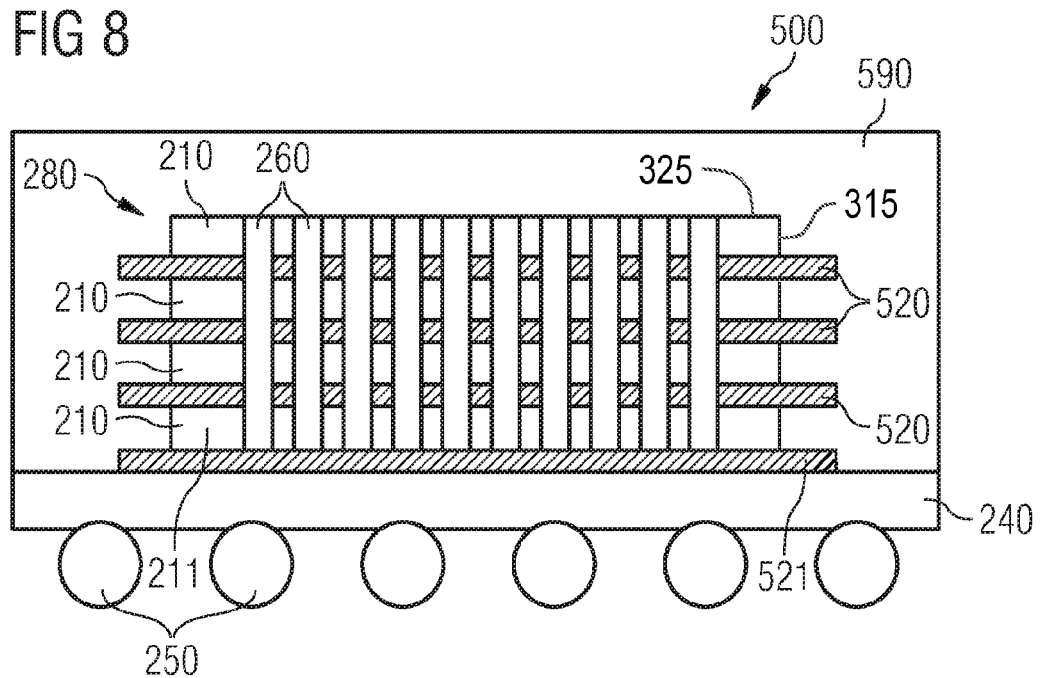

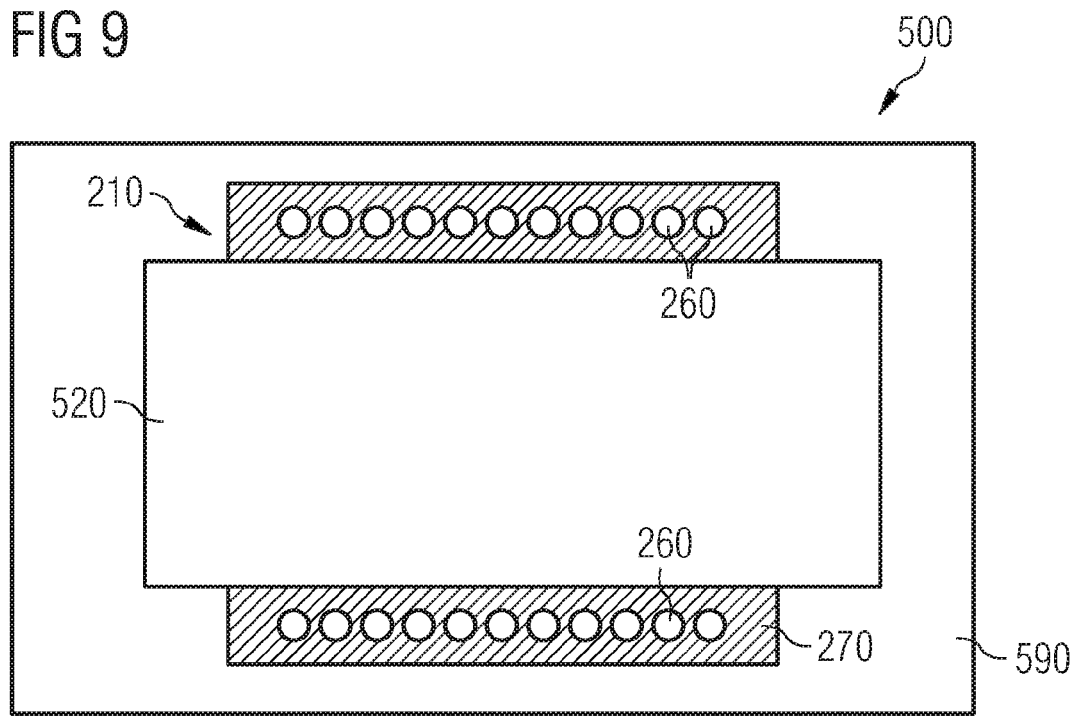

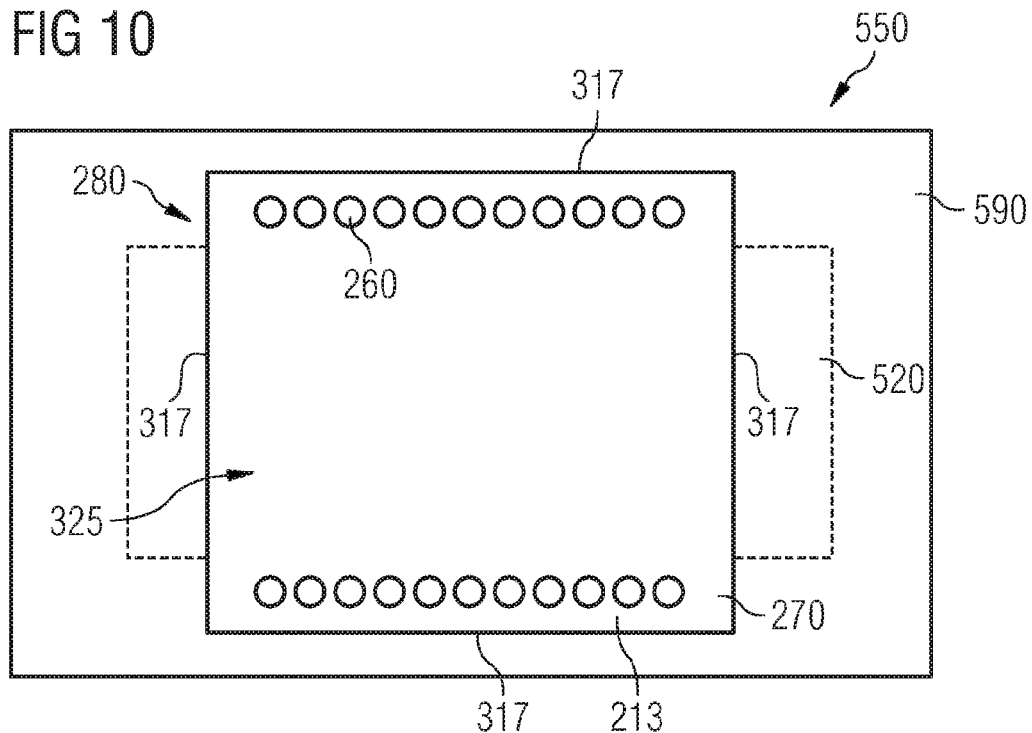
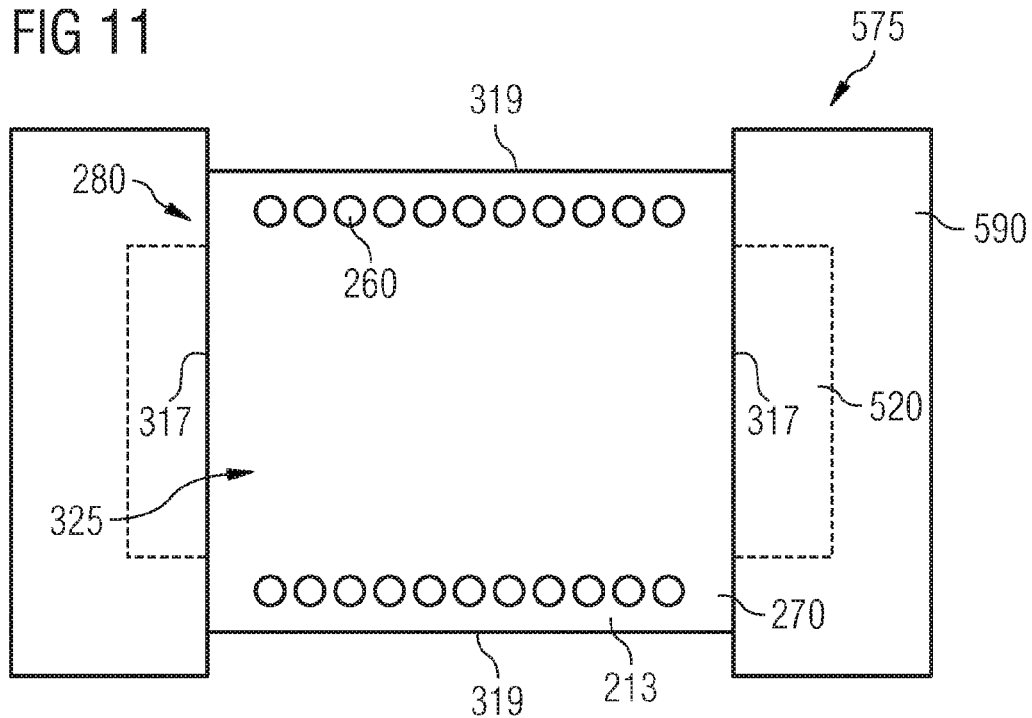

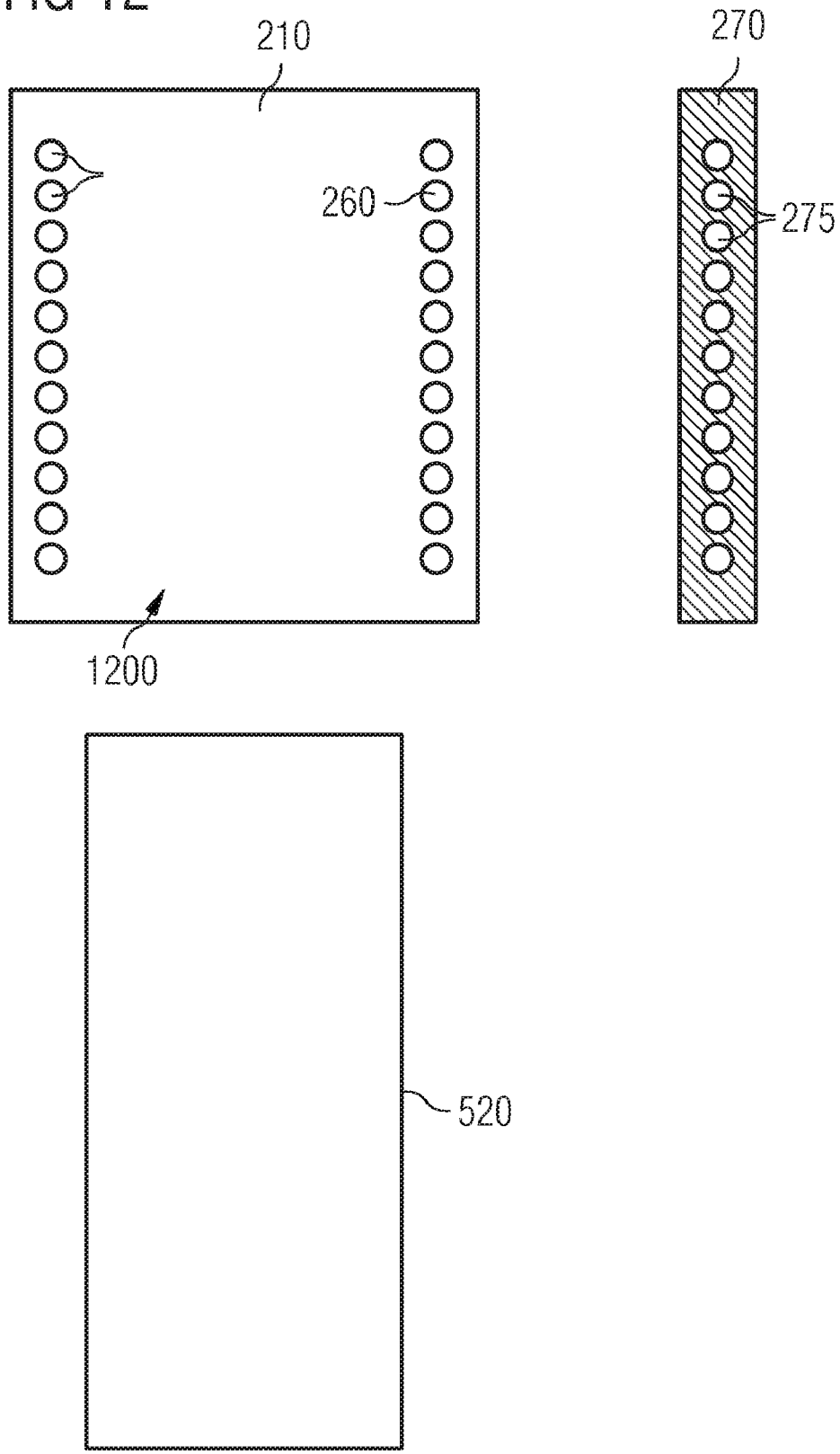

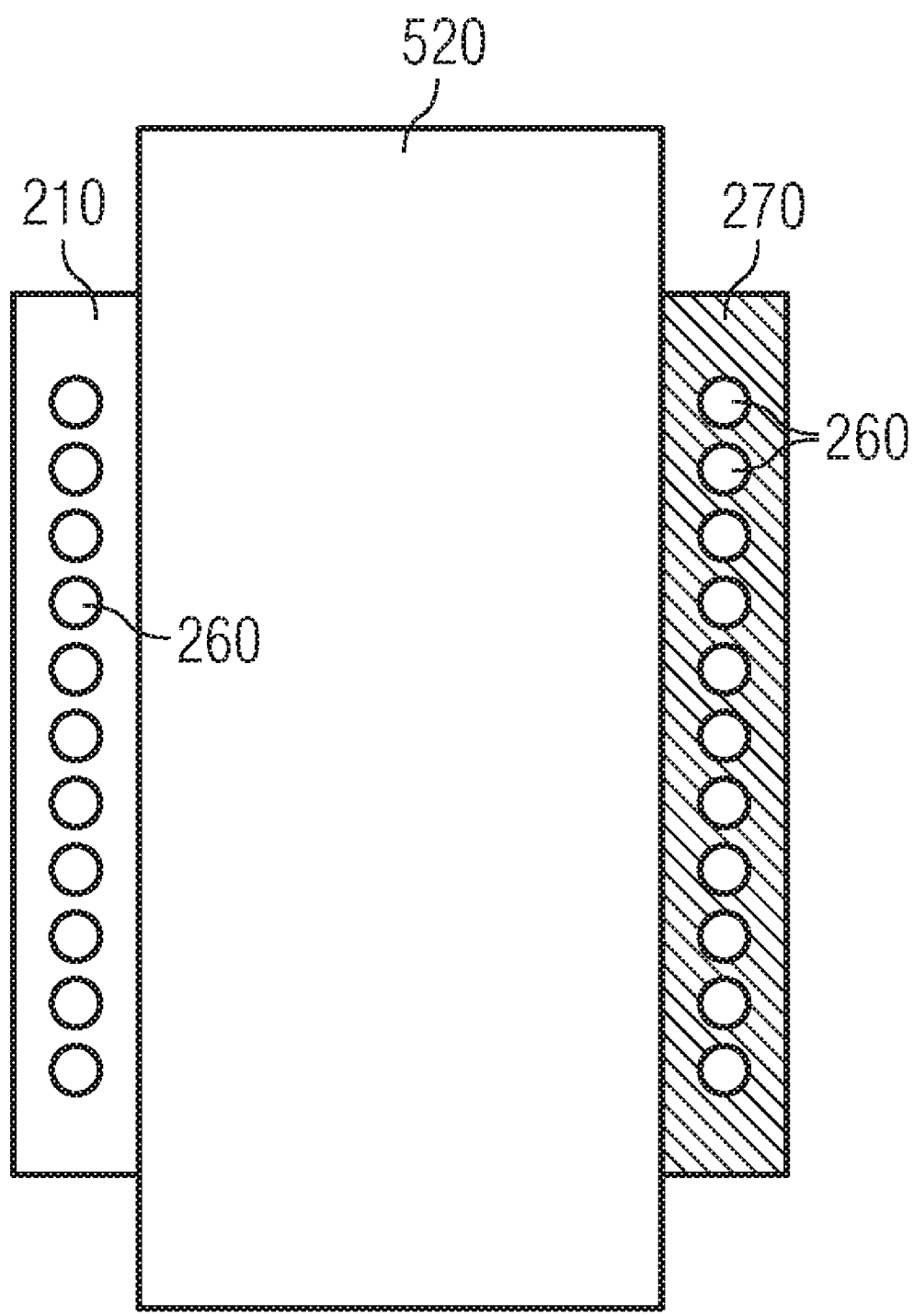

INTEGRATED CIRCUIT PACKAGE WITH A HEAT DISSIPATION DEVICE

BACKGROUND OF THE INVENTION

1. Field of the Invention

The present invention relates generally to the field of integrated circuit devices and more particularly to packages for integrated circuits where the package includes a heat sink. The present invention also relates to a method of making a package for integrated circuits including a method of forming a heat dissipation device.

2. Description of the Related Art

The performance levels of microelectronic devices, for example integrated circuits, power amplifiers, etc., are continually increasing to keep pace with the demands of modern technology. Performance levels such as clock speed are closely tied to the number and density of features, for example transistors, patterned onto the microelectronic device. Faster processing by the microelectronic device demands faster clock speeds. Faster clock speeds, in turn, mean more switching and power dissipation per unit time. The performance levels of microelectronic devices should continually improve as the size of the transistors is decreased and the density of the features is increased. However, small, closely packed features dissipate large amounts of heat which may limit performance levels. Heat is often dissipated from small, select regions of the device typically by heat sinks.

Temperature control has thus emerged as a limiting factor in the design of microelectronic devices. New-age devices, such as high-power amplifiers and multi-chip modules, radiate particularly large amounts of heat. Failure to effectively conduct heat away generally leaves these devices operating at high temperatures, ultimately resulting in decreased performance and reliability. This effect can be readily seen in semiconductor packages.

Semiconductor packages that include stacked semiconductor dies, otherwise known as semiconductor "chips" or "integrated circuits," are becoming increasingly popular. Such packages allow dies that perform the same function, such as two memory dies, or different functions, such as a processor die and a memory die, to be combined into a single package. This improves density and is especially useful in applications where package size, particularly small package size, is important, such as in cell phones, PDAs, camcorders, and other wireless consumer products.

Moreover, an increase in the operation speed of integrated circuit devices is also rapidly advancing. With an increased integration density of integrated circuit devices the amount of heat generated correspondingly increases. Additionally, increased demand for downsizing modules accommodating microelectronic components including integrated circuit devices complicates both the need to remove excessive heat generated by integrated circuit devices and how to accomplish heat removal within an increasingly limited area. Thus the overall heat density associated with microelectronic devices and modules increases. Furthermore, many integrated circuit devices including memory devices and chip type circuit components are mounted on a printed circuit board so that the number of components mounted on a module has a tendency to increase and resulting in decreased surface area available for conventional heat sinks.

Integrated circuit devices are conventionally bundled together in packages which are then mounted on a printed circuit board to form multi-chip modules. Integrated circuit packages usually require a cover cap or encapsulant of some type over the integrated circuit devices to protect it and to provide a large flat surface for pick and place up operations. However, any cover cap or encapsulant above the integrated circuit increases the thermal resistance path to an ambient environment and hence the operation temperature of the integrated circuit, and the resulting heat density of the multi-chip module.

Various means are being used to mitigate the effects of such covers or caps and in general the high amount of heat generated within a package. One approach has been to use a capped integrated circuit with a thin layer of thermally conductive grease between the integrated circuit and the cap. Another means to decrease the operation temperature of the integrated circuit is to attach a heat sink on top of the cap or on top of the encapsulant. An example would be to attach a heat spreader with fins on top of the package, that is a heat spreader placed on top of the encapsulant or cap.

Another means to mitigate the effect of such covers or caps and generally decrease the overall operating temperature of the integrated circuits in the package are to include an internal heat spreader within the package. Another conventional means of heat dissipation include a heat sink coupled to the upper surface area of a die stack and to the surface area of the substrate on which the die stack lies. This design aims to improve the heat dissipation pathway that travels from the upper surface area of a die stack and over the substrate to the solder binding and to a printed circuit board. However, this design is successful mainly when the printed circuit board is adequately cool when compared to the package. Still, the conventional pathway for heat transfer is through the upper most surface of the package and from there into the ambient surroundings or even to another heat sink that is mounted on top of the package.

Nevertheless, one problem with the preferential heat dissipation pathway travelling in the vertical direction through the package, especially in die stack packages, is that the top most integrated circuit will be cooled much better than any underlying integrated circuits. One reason for this may be because the thermal resistance of the package from the bottom to the top surface accounts for a considerable part of the overall thermal resistance to the ambient surroundings. The thermal resistance is considerable because the heat must pass through the entire stack in order for any heat generated within the die stack to be discharged into the ambient atmosphere.

This means that for any generated heat to eventually dissipate through the top surface of a die stack, the heat must pass through multiple layers of various components to reach the upper most layer in the package. For instance, the heat discharge pathway may include going through the integrated circuits within the die stack, through any adhesive layers between the integrated circuits, and often through a spacer. Of course such a preferential heat dissipation pathway means that in order to cool the lower most integrated circuit within a stack, the heat must travel through the entire stack and any intermediate layers to be discharged through the upper surface and into the ambient surroundings, likely resulting in particular difficulties for sufficiently cooling the lower most integrated circuit within a stack.

Another potential drawback of having the heat transfer pathway preferentially travel from the bottom most integrated circuit through the die stack and to the top most integrated circuit is that each succeeding upper integrated circuit may be heated up by the lower integrated circuit as heat passes from a lower integrated circuit to an above lying integrated circuit and so on up the die stack. Moreover, there are some uses of stacked integrated circuits which do not permit the upper most surface to function simultaneously as a heat dissipation surface available for mounting a heat spreader. For example a sensor array type integrated circuit may not permit a heat sink attached to the upper surface of an integrated circuit package.

In most cases a heat sink is conventionally mounted on an integrated circuit package parallel to the upper integrated circuit surface area of the die stack. Such a heat sink serves the purpose of spreading the heat in a horizontal plane that is generally parallel to the upper integrated circuit surface area, resulting in the preferential vertical heat pathway through each die stack component. Furthermore, any intermediate interfaces between integrated circuits often contribute to the overall thermal resistance of a die stack thereby limiting the heat dissipation potential of the bottom most integrated circuit and so on through the stack up to the top most integrated circuit. Some examples of intermediate interfaces that may increase the heat resistance of a die stack include spacers or adhesives.

SUMMARY OF THE INVENTION

The present invention is directed to forming a so called 'vertical' heat dissipation device to overcome or at least reduce the effects of one or more the problems set forth above. The present invention is directed to overcoming the thermal resistance often associated with die stack packages where a principal heat dissipation pathway is through the stack in a vertical direction, i.e. from a bottom most integrated circuit, through the entire stack, and to the upper most integrated circuit.

The present invention may also have particular advantages for applications where the upper most integrated circuit within a die stack assembly may not be simultaneously used as a heat discharging surface such as may be the case with sensor arrays. Moreover, the present invention is particularly useful and effective for die stack assemblies having high aspect ratios i.e. in die stacks assemblies that have a very small footprint when compared to the integrated circuits thicknesses or relative to the overall height of the die stack assembly. The vertical heat spreader or dissipation device may also enable the selective cooling of integrated circuits within the die stack assembly without straining or burdening the thermal dissipation of the above lying integrated circuit.

Another believed advantage of the present invention is the invention's ability to dissipate generated heat spikes that are often associated with electrical load spikes in the integrated circuits within die stack assembly, especially load spikes in the lowermost and innermost areas of the die stack assembly. As higher and higher frequencies are demanded of integrated circuits, more and more heat will be generated and need to be dissipated to improve electrical reliability of the integrated circuits. A vertical heat dissipation device attached to the side of a heat package may overcome the above drawbacks.

One aspect to the present invention is seen in an integrated circuit assembly including a die stack assembly having a heat dissipation device thermally coupled to a lateral surface of the die stack assembly. The die stack assembly furthermore includes a plurality integrated circuits placed on each other. The heat dissipation device is at least as thermally conductive as 3 W/m·K.

Another aspect of the present invention is in a package for an integrated circuit assembly. The package includes a die stack assembly attached to a chip carrier where the die stack assembly includes a plurality of integrated circuits placed on each other. A heat dissipation device is thermally coupled to a lateral surface of the die stack assembly with the heat dissipation device being at least as thermally conductive as 3 W/m·K. The package also includes an encapsulant surrounding a residual surface area of the die stack assembly.

According to another aspect to the present invention there is a method of making a package for an integrated circuit assembly wherein the method includes steps as described in the following. In an initial step, a die stack assembly is provided where the die stack assembly comprises a plurality of integrated circuits placed on each other. In yet another step, a heat dissipation device is thermally connected to a lateral surface of the die stack assembly where the heat dissipation device is at least as thermally conductive as 3 W/m·K.

Another aspect of the present invention is seen in a package for an integrated circuit assembly wherein the package includes a die stack assembly comprising a plurality of integrated circuits placed on each other. A heat dissipation device comprising an encapsulant is thermally coupled to and surrounds the die stack assembly. At least one heat conducting intermediate layer between integrated circuits that extends beyond the integrated circuits, is thermally coupled to the heat dissipation device.

BRIEF DESCRIPTION OF THE DRAWINGS

The above recited features of the present invention will become clear from the following description taking in conjunction with the accompanying drawings in which like reference numerals identify like elements. It is to be noted however, that the accompanying drawings illustrate only typical embodiments of the present invention and are therefore not to be considered limiting of the scope of the invention. The present invention may admit other equally effective embodiments. The present invention will be described below in more details with reference to the embodiments and drawings.

FIG. 1 shows a diagrammatic plan view of an integrated circuit assembly, in this case a conventional memory module.

FIG. 2 shows a diagrammatic cross-sectional view of a package for an integrated circuit assembly.

FIG. 3 shows a diagrammatic cross-sectional view of a package for an integrated circuit assembly according to one aspect of the present invention.

FIG. 4 shows a diagrammatic cross-sectional view of a package for an integrated circuit assembly according to another aspect of the present invention.

FIG. 7 shows a diagrammatic cross-sectional view of a package for an integrated circuit assembly along lines B-B of FIG. 6 according to one aspect of the present invention.

FIG. 8 shows a diagrammatic cross-sectional view of a package for an integrated circuit assembly along lines B-B of FIG. 6 according to another aspect of the present invention.

FIG. 9 shows a cross-sectional top view of a package for an integrated circuit assembly along lines A-A of FIG. 5 according to one aspect of the present invention.

FIG. 10 shows a top view of a package for an integrated circuit assembly according to one aspect of the present invention.

FIG. 11 shows a top view of a package for an integrated circuit assembly according to another aspect to the present invention.

FIG. 12 shows a top view of some of the components used to assemble a package for an integrated circuit assembly according to one aspect of the present invention.

FIG. 13 shows a top view of the components in FIG. 12 assembled together according to one aspect of the present invention.

DETAILED DESCRIPTION OF THE PREFERRED EMBODIMENT

Figure 5:
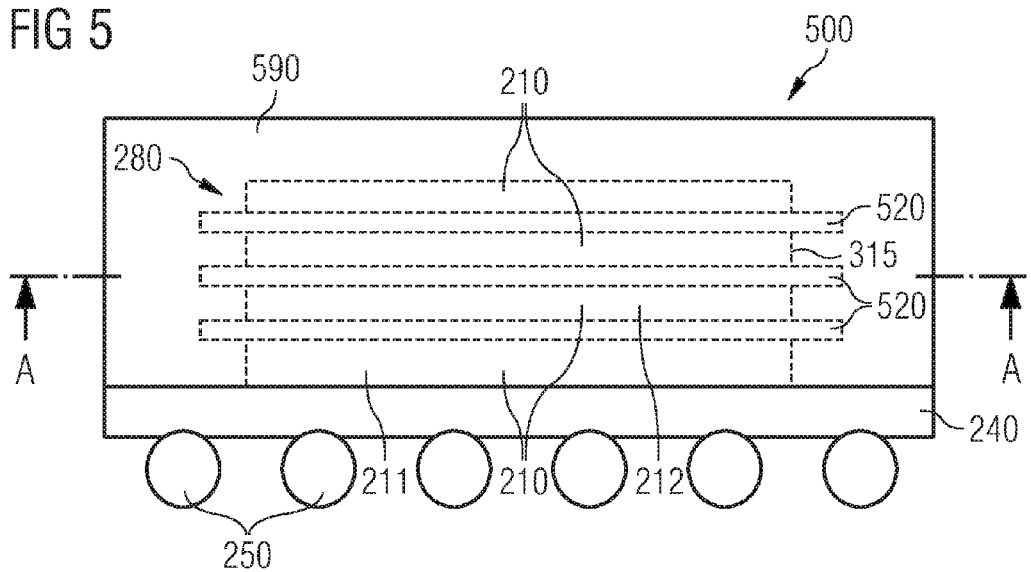
FIG. 5 shows a diagrammatic plan view of a package for an integrated circuit assembly according to one aspect of the present invention.

These aspects of the present invention may provide particular advantages for improved heat transfer through packages for an integrated circuit assembly. Turning now to FIG. 1, a diagrammatic plan view of a multi-chip module, in this case a conventional memory module 100 is shown. The memory module shown is just one example of where packages of integrated circuit assemblies may be employed. The memory module 100 comprise packages for an integrated circuit assembly 140. The packages 140 may comprise integrated circuit devices such as memory devices, that may be DRAM or Dynamic Random Access Memory. A memory module 100 conventionally has a plurality of packages for integrated circuit assemblies 140. Next to the packages 140 may be other devices 160 such as termination resistors, capacitors, and the like. These devices 160 are also placed on the printed circuit board 120.

The printed circuit board 120 has an array of contact pads 180 provided along a side edge of each face of the printed circuit board 120 for electrically connecting with an appropriate mating socket. FIG. 1 illustrates a conventional embodiment of a multi-chip module which may employ the present invention. FIG. 1 is also shown to orient the reader to an application of the present invention, though other applications beyond a memory module may employ the present invention. Some examples of other applications that may utilize the present invention include mother boards utilizing a central processing unit or CPU, video and sound modules, or any type of application on which a package of integrated circuit devices is employed.

FIG. 2 shows a diagrammatic cross-sectional view of a conventional package for an integrated circuit assembly 200. The package 200 includes a die stack assembly 280 attached to a chip carrier or substrate 240 where the die stack assembly comprises a plurality of integrated circuits 210 placed on each other. An encapsulant 230 surrounds the die stack 280. The die stack assembly 230 may include an intermediate layer 220 in between the integrated circuits 210. The intermediate layer 220 may be employed for joining two separate components when forming an integrated circuit package, such as joining an integrated circuit 210 and the chip carrier or substrate 240. The intermediate layer 220 may also comprise a spacer of some variety or some adhesive joint or bond.

The package for an integrated circuit assembly 200 may also include a means for connecting the package 200 to a printed circuit board (not shown) which is here represented as a ball grid array or BGA 250 on the chip carrier or substrate 240. FIG. 2 represents a conventional package for integrated circuits, in particular a conventional die stack assembly.

Turning now to FIG. 3, a diagrammatic cross-sectional view of a package for integrated circuits according to one embodiment of the present invention is shown. A package for an integrated circuit assembly 300 includes a die stack assembly 280 attached to a chip carrier 240 where the die stack assembly comprises a plurality of integrated circuits 210 placed on each other. A heat dissipation device 390 is thermally coupled to a lateral surface 315 of the die stack assembly 280. The heat dissipation device 390 is at least as thermally conductive as 3 W/m·K. In an alternative embodiment, the heat dissipation device 390 may have a thermal conductivity of at least 10 W/m·K.

Because the heat generated by the die stack assembly will be discharged along a horizontal pathway through the die stack assembly rather than a vertical pathway and then in a vertical direction of the heat dissipation device, the heat dissipation device may be referred to as a vertical heat spreader or vertical heat dissipation device. The vertical heat spreader or dissipation device may enable the selective cooling of integrated circuits within the die stack assembly without straining or burdening the thermal dissipation of the above lying integrated circuit. This is because any heat generated by the lower and inner integrated circuits 210 may be conducted through a side surface of the circuit and to the heat dissipation device 390 where each integrated circuit 210 is thermally coupled to the heat dissipation device 390.

The lateral surface 315 may also be metallized to both increase heat conduction through the side surface of the integrated circuits 210 and to form a coupling region in order to more readily connect the heat dissipation device 390 to the lateral surface 315 of the die stack assembly 280. With a metallized lateral surface 315, the heat dissipation device 390 may be soldered to the lateral surface 315 of the die stack assembly 280. With the placement of a heat dissipation device 390 on the side of a die stack assembly, any heat generated within the die stack assembly 280 may be laterally directed through the die stack assembly 280 to the heat dissipation device 390 and subsequently discharged through the heat dissipation device 390. Moreover, the heat dissipation device 390 may extend above the die stack assembly 280 as shown in FIG. 3 thereby permitting heat to also discharge on the top surface of the package for an integrated circuit assembly 300.

The package for an integrated circuit assembly 300 also includes an encapsulant 230 for surrounding a residual surface area 335 of the die stack assembly. It should be noted that a residual surface area includes any area of the die stack assembly not attached to either a heat dissipation device 390 or a chip carrier 240. A means for attaching the package 300 to a printed circuit board is represented here by a ball grid array or BGA 250. However, other means of attaching the package to a printed circuit board or other like device are contemplated and within the scope of the invention, examples of which may be a pin grid array or land grid array. Moreover, the integrated circuits 210 within the die stack assembly 280 may also be electrically connected to each other through conventional means such as silicon thru vias or wire bonding.

A plurality of heat conducting intermediate layers 320 may be placed in between the integrated circuits 210 and thermally coupled to the heat dissipation device 390 in order to improve heat conduction to the vertical heat dissipation device 390. Thus, addition of the heat conducting intermediate layers 320 more efficiently removes heat generated from the inner most part of the die stack 280. The heat conducting intermediate layers 320 may comprise materials such as aluminum, gold, copper, silver, and their alloys.

Other materials that are conventionally used for heat conduction are also suitable. The heat conducting intermediate layer may be as thermally conductive as 100 W/m·K or greater. The heat dissipation device may also comprise materials such as aluminum, gold, copper, silver and their alloys. It may also include graphite and graphite foils. Another less conventional material that may be suitable for both the heat conducting intermediate layers 320 and the heat dissipation device 390, largely because of its high heat conductance and electrical insulating characteristics, is diamond and its related species such as polycrystalline diamond.

FIG. 4 shows a diagrammatic cross-sectional view of a package for an integrated circuit assembly according to another aspect of the present invention. Since the packages for an integrated circuit assembly of FIGS. 3 and 4 are similar, not all elements are described anew and are denoted by identical reference signs. A package for an integrated circuit assembly 400 includes a die stack assembly 280 attached to a chip carrier 240 where the die stack assembly comprises a plurality of integrated circuits 210 placed on each other.

A heat dissipation device 490 is thermally coupled to at least one lateral surface 315 and a horizontal surface 325 of the die stack assembly 280. Additionally, the heat dissipation device 490 is at least as thermally conductive as 3 W/m·K. In an alternative embodiment, the heat dissipation device 490 may be at least as thermally conductive as 10 W/m·K.

The lateral surface 315 and/or the horizontal surface 325 may also be metallized to both increase heat conduction through the side walls and top surface of the integrated circuits 210 and to form a coupling region in order to more readily connect the heat dissipation device 490 to the lateral surface 315 and/or horizontal surface 325 of the die stack assembly 280.

The package for an integrated circuit assembly 300 also includes an encapsulant 230 for surrounding a residual surface area 345 of the die stack assembly. In this aspect of the invention the residual surface area is a remaining lateral surface 315 not attached to the heat dissipation device 490. A plurality of heat conducting intermediate layers 320 may be placed in between the integrated circuits 210 and thermally coupled to the heat dissipation device 490 in order to improve heat conduction to the heat dissipation device 490. Thus, addition of the heat conducting intermediate layers 320 more efficiently removes heat generated from the inner most part of the die stack 280.

Moreover, the vertical heat dissipation device 490 may also be thermally coupled to more than one lateral surface 315 of the die stack assembly 280, thereby incorporating more heat dissipation devices into a package 400. A separate external conventional heat sink may be subsequently coupled to a lateral or horizontal surface of the heat dissipation devices 390 or 490 thereby multiplying the effectiveness of the heat dissipation devices 390 or 490 in either FIG. 3 or FIG. 4. Furthermore, the heat dissipation device may be coupled to the chip carrier or substrate for improved heat dissipation through the printed circuit board to which the package will be soldered.

According to another embodiment of the invention, an integrated circuit assembly comprises a die stack assembly that includes a plurality of integrated circuits placed on each other, such as the die stack assemblies shown in FIGS. 3 and 4. The integrated circuit assembly also includes a heat dissipation device thermally coupled to a lateral surface of the die stack assembly where the heat dissipation device is at least as thermally conductive as 3 W/m·K. In an alternative embodiment, the heat dissipation device may be at least as thermally conductive as 10 W/m·K.

In another embodiment of the invention, the heat dissipation device is thermally coupled to a horizontal surface and at least one lateral surface of the die stack assembly of the integrated circuit assembly. The lateral and/or horizontal surface may be metallized to both improve the heat conduction path through the die stack assembly to the heat dissipation device and to simplify thermal coupling of the heat dissipation device to the die stack assembly.

In yet another embodiment of the invention, the integrated circuit assembly may include a heat dissipation device that encapsulates the die stack assembly when the die stack assembly is on a chip carrier or substrate. In another embodiment of the invention, the die stack assembly of the integrated circuit assembly may include at least one heat conducting intermediate layer between the integrated circuits. The heat dissipation device may be thermally coupled to the heat conducting intermediate layers thereby improving heat removal from the innermost and lowermost integrated circuits within the die stack assembly. The increased heat dissipation of the innermost and lowermost integrated circuits improves, it is believed, because an integrated circuit assembly including such heat conducting intermediate layers draws the heat in a lateral direction to the heat dissipation device and to the ambient surroundings.

The heat conducting intermediate layers of an integrated circuit assembly may be fabricated from any of the following materials: aluminum, gold, copper, silver, and their alloys. Other materials that are conventionally used for heat conduction are also suitable. The heat dissipation device may also comprise materials such as aluminum, gold, copper, silver and their alloys and carbon and carbon allotropes. Another less conventional material that may be suitable for both the heat conducting intermediate layer and the heat dissipation device, because of its high heat conductance and electrical insulating characteristics, is diamond and its related species such as polycrystalline diamond. In any of the embodiments, the integrated circuits within the die stack assembly may also be electrically connected to each other through conventional means such as silicon thru vias or wire bonding.

Turning now to FIG. 5, a diagrammatic plan view of a package for an integrated circuit assembly 500 according to one aspect of the present invention is shown. In this view, the die stack assembly 280 including heat conducting intermediate layers 520 are normally not visible as indicated by the dashed lines. An encapsulant 590 surrounding the die stack assembly 280 normally prevents the die stack assembly from being seen due to the opaque nature of conventional encapsulants. However, some applications, such as those utilizing sensor arrays, may have transparent or partially transparent molds or encapsulants.

In this embodiment of the invention, a package for an integrated circuit 500 includes not only the die stack assembly 280 attached to a chip carrier 240, but also includes a plurality of heat conducting intermediate layers 520 in-between a plurality of integrated circuits 210 that are placed on each other. The heat conducting intermediate layers 520 may extend beyond the lateral surface 315 of the die stack assembly 280 i.e. beyond the side walls of the integrated circuits 210.

In this embodiment of the invention, the heat dissipation device comprises the encapsulant 590 and surrounds the die stack assembly 280. The heat dissipation device comprising the encapsulant 590 is thermally coupled to the lateral surfaces 315 and a horizontal surface 325 of the die stack 280. Thus, the encapsulant may comprise a heat conducting material that is at least as thermally conductive as 3 W/m·K. In an alternative embodiment, the heat dissipation device comprising the encapsulant may be at least as thermally conductive as 10 W/m·K.

In one embodiment of the invention, the encapsulant comprises a heat conducting material such as a resin filled with a heat conducting material. For example the resin may be epoxy based. The heat conducting material may be aluminum oxide or other similar additives that will increase the heat conduction of a resin and are readily available for making encapsulants or molds. Some examples include aluminum nitride and boron nitride. Additionally, the filler material may include carbon and carbon allotropes such as graphite, graphite flakes, and carbon nanotubes.

Heat conducting intermediate layers 520 may extend into the heat dissipation device comprising a heat conducting encapsulant 590 thereby possibly providing an improved thermal coupling between the die stack 280 and heat dissipation device comprising a heat conducting encapsulant 590. An advantage of this type of configuration, is that the heat generated by the lower and innermost integrated circuits 211, 212 may be dissipated in a lateral direction through the heat conducting intermediate layers 520 and to the heat dissipation device comprising a heat conducting encapsulant 590.

This aspect of the invention may result in decreasing the overall thermal resistance of the vertical heat dissipation pathway to the top most integrated circuit. This is particularly beneficial if localized electrical load spikes occur in the lower and/or innermost integrated circuits 211, 212 because load spikes tend to cause an associated heat generation spike and increase the operating temperature of the entire die stack assembly 280. With the present configuration of the invention as shown in FIG. 5, any heat generated due to electrical load spikes may be efficiently dissipated through the heat conducting intermediate layers 520, to the heat dissipation device comprising a heat conducting encapsulant 590, and discharged to the ambient surroundings.

Figure 6:
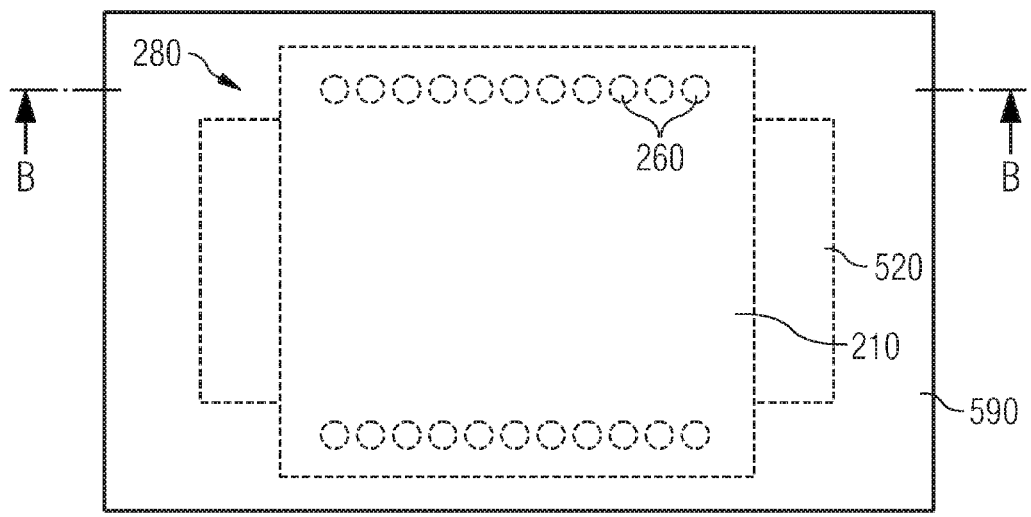
FIG. 6 shows a top view of a package for an integrated circuit assembly according to one aspect of the present invention.

FIG. 6 shows a top view of the package for an integrated circuit assembly 500 as illustrated in FIG. 5. Again, the die stack assembly 280 including heat conducting intermediate layers 520 are normally not visible from the top as indicated by the dashed lines. An encapsulant 590 surrounding die stack assembly 280 generally prevents the die stack assembly from being seen due to the opaque nature of conventional surrounding encapsulants. However, as will be shown in later Figures, portions of the die stack assembly 280 may be visible in other embodiments of the invention.

The integrated circuits 210 in the die stack assembly 280 may be electrically connected to each other through a signal line. The signal lines in this embodiment are depicted here by silicon thru vias 260 although other means are contemplated such as wire-bonding. The heat conducting intermediate layers 520 may cover a substantial area of the integrated circuits 210 so as to increase the contact surface area with the integrated circuits 210 thereby increasing the amount of heat spread and discharged through the intermediate layers 520 to the heat dissipation device comprising a heat conducting encapsulant 590.

In FIGS. 7 through 11 various embodiments of the present invention are shown. In particular various embodiments of a package for an integrated circuit assembly including a heat dissipation device comprising a heat conducting encapsulant. Other features and variations of the package for an integrated circuit assembly, such as encapsulant form and heat conducting intermediate layer configurations, illustrated in FIGS. 7-11 are shown.

Turning first to FIG. 7, a diagrammatic cross-sectional view of a package for an integrated circuit assembly 500 along lines B-B of FIG. 6 is shown according to one aspect of the present invention. The cross-section is taken through the silicon thru vias 260 and illustrate how the integrated circuits 210 are connected to each other when forming a die stack assembly 280. The heat conducting intermediate layers 520 does not cover any of the signal line area in this embodiment. Taken together, the heat conducting intermediate layers 520 may become an internal horizontal heat spreader within the die stack assembly 280 and within the package for an integrated circuit assembly 500. In this embodiment, the heat conducting intermediate layers 520 are thermally coupled to the heat dissipation device comprising a heat conducting encapsulant 590.

FIG. 8 also shows a diagrammatic cross-sectional view of a package for an integrated circuit assembly along lines B-B of FIG. 6 according to another aspect of the present invention. Since the packages for an integrated circuit assembly of FIGS. 7 and 8 are similar, not all elements are described anew and are denoted by identical reference signs. In this variation, an intermediate heat conducting layer 521 is between the chip carrier 240 or substrate and a bottom most integrated circuit 211 within the die stack assembly 280.

This configuration may permit heat generated between the chip carrier 240 and the bottom most integrated circuit 211 to be more efficiently discharged through the heat conducting intermediate layer 520 and to the heat dissipation device comprising a heat conducting encapsulant 590. Other similar variations are contemplated and within the scope of the invention, such as perhaps replacing any of the heat conducting intermediate layers 520 with either no intermediate layer or a spacer in-between each integrated circuit 210 within the die stack assembly 280. The exact configuration of heat conducting intermediate layers within the die stack may be altered according to the desired heat transfer specification requirements and the particular application for which the package 500 is engineered.

Another aspect of the present invention is seen in a package for an integrated circuit assembly wherein the package includes a die stack assembly attached to a chip carrier. The die stack assembly includes a plurality of integrated circuits placed on each other. A heat dissipation device comprising an encapsulant is thermally coupled to and surrounds the die stack assembly. At least one heat conducting intermediate layer between integrated circuits that extends beyond the integrated circuits, is thermally coupled to the heat dissipation device.

In one embodiment of the invention, a plurality of heat conducting intermediate layers are between the integrated circuits and comprises at least one of the following materials: aluminum, gold, copper, silver, and their alloys and carbon and carbon allotropes. An adhesive layer may also be between the integrated circuits, such as adhesive pre-cut tape, thereby joining the integrated circuits to each other and forming the die stack assembly. The integrated circuits may also be electrically connected to each other such as through a signal line. Conventional electrical connections may also include silicon thru hole vias and wire-bonding.

FIG. 9 shows a cross-sectional top view of a package for an integrated circuit assembly 500 along lines A-A of FIG. 5 according to one aspect of the present invention. In this Figure, the location of the heat conducting intermediate layer 520 is illustrated. The heat conducting intermediate layer 520 may be on an area of the integrated circuit 210 without the signal lines, here represented as silicon thru vias 260. The entire surface area without the silicon thru vias 260 of the integrated circuit 210 may be covered by the heat conducting intermediate layer 520, however less coverage area is also possible depending on heat transfer needs of the particular die stack assembly within the package. In this embodiment, an adhesive layer here depicted as adhesive pre-cut tape 270 may cover the signal line area of the integrated circuit 210 thereby joining two integrated circuits within the die stack assembly. The method of making a package for an integrated circuit assembly and the die stack assembly will be described in subsequent drawings.

FIG. 10 shows a top view of a package for an integrated circuit assembly 550 according to one aspect of the present invention. In this embodiment, a heat dissipation device comprising a heat conducting encapsulant 590 surrounds only the lateral surfaces 317 of the die stack assembly 280. In other words only the die stack assembly lateral surfaces 317 and not a horizontal surface 325 are surrounded by the encapsulant thereby exposing a top integrated circuit 213 to the ambient surroundings. The heat conducting layers 520 are thermally coupled to and surrounded by the heat dissipation device comprising a heat conducting encapsulant 590.

This configuration thus provides a heat discharge path horizontally through the heat conducting intermediate layers 520 and to the heat dissipation device comprising a heat conducting encapsulant 590. This may be particularly helpful for packages where sensory devices are located on the top most integrated circuit within the die stack assembly and thus may not be simultaneously used as a heat dissipating surface or perhaps may not be covered with any encapsulant. Because only the top surface of a die stack assembly is shown, the adhesive pre-cut tape that may be placed over a signal line area of the integrated circuits as shown in FIG. 9 is not shown; conventionally, the adhesive pre-cut tape is layered in-between integrated circuits.

FIG. 11 shows a top view of a variation of the package for an integrated circuit assembly shown in FIG. 10, according to another aspect to the present invention. Since the packages for an integrated circuit assembly of FIGS. 10 and 11 are similar, not all elements are described anew and are denoted by identical reference signs. In this variation of the embodiment shown in FIG. 10, the package for an integrated circuit assembly 575 comprises a die stack assembly 280 where only the lateral surfaces 317 are surrounded by the heat dissipation device comprising heat conducting encapsulant 590. The lateral surfaces 317 of the die stack assembly 280 comprise those lateral surfaces where the heat conducting intermediate layers 520 extend beyond the integrated circuits such as the top most integrated circuit 213 shown here.

In other words, the horizontal surface 325 and the lateral surfaces 319 of the die stack assembly 280 are not surrounded by the heat dissipation device comprising a heat conducting encapsulant 590. The lateral surfaces 319 not surrounded comprise those lateral surfaces where the heat conducting intermediate layers 520 do not extend beyond the integrated circuits such as the top most integrated circuit 213 shown here. Such a configuration of heat conducting intermediate layers 520 and the encapsulant 590 my be desirable for particular applications where only a portion of the package 575 may comprise the encapsulant 590.

According to another aspect to the present invention, there is a method of making a package for an integrated circuit assembly wherein the method includes steps as described in the following. In an initial step, a die stack assembly is provided where the die stack assembly comprises a plurality of integrated circuits placed on each other. In another step, the die stack assembly may be mounted on a chip carrier although in some embodiments a chip carrier or substrate is unnecessary. One example of which is having a so-called direct flip chip assembly connected to a printed circuit board where the lowest die of the flip chip assembly is attached to the printed circuit board directly without a chip carrier. In yet another step, a heat dissipation device is thermally connected to a lateral surface of the die stack assembly where the heat dissipation device is at least as thermally conductive as 3 W/m·K. In an alternative embodiment, the heat dissipation device may be at least as thermally conductive as 10 W/m·K.

In another embodiment of the invention, the method further comprises metallizing the lateral surface of the die stack assembly and thermally connecting the heat dissipation device to the metallized lateral surface. Other methods of thermally coupling the heat dissipation device to the die stack assembly are also possible including adhesives, molds, pastes, films, and phase change materials. Additionally, the die stack assembly may be surrounded with an encapsulant.

Another step of the method may include filling any signal lines within the die stack with solder material to electrically connect the signal lines. The heat dissipation device may also be thermally coupled to a horizontal surface of the die stack assembly in another step. The embodiments and their variants as shown and described in FIGS. 3 and 4 may be made according to these methods. Other embodiments as shown and described in FIGS. 5 through 11 may also be made according to these methods and by incorporating the die stack assembly made according to another aspect of the invention as described below.

Turning now to FIG. 12, a top view of some of the components used to assemble a package for an integrated circuit assembly according to one aspect of the present invention is shown. In particular, one method of making the die stack assembly will be shown. Three components may be generally used to assemble the die stack assembly according to one aspect of the invention: an integrated circuit 210, a heat conducting intermediate layer 520, and an adhesive pre-cut tape 270. The integrated circuit 210 includes a signal line pattern, here represented by silicon thru vias 260.

The adhesive pre-cut tape 270 has holes 275 matching the signal line pattern 260 on the integrated circuit 210. The pre-cut tape may comprise one or two sides coated with adhesive. Moreover, a plurality of pre-cut tapes may be between the integrated circuits. The heat conducting intermediate layer 520 may be wide enough to cover an area 1200 of the integrated circuit 210 without the signal line patter 260.

Additionally, the heat conducting intermediate layer may comprise a thermal interface material or an adhesive layer for thermal and mechanical coupling of the heat conducting intermediate layers to the integrated circuits of the die stack assembly. For example, a foil of a thermally conductive material may be coated with a thermal interface material and/or adhesive.

However, one possible reason for employing heat conducting intermediate layers and adhesive precut tape that are separate instead of only employing thermally conducting foil coated with an adhesive as a heat conducting intermediate layer is the following: most of the materials suitable for an intermediate layer are also electrically conducting and would produce shorts between the die and die signal lines crossing the layer in the final package assembly. Therefore, a second electrically insulating material such as adhesive precut tape may be introduced. Nevertheless, the exact configuration may be determined by one of ordinary skill in the art in order to achieve the desired electrical and thermal specifications of the package.

FIG. 13 shows a top view of the components in FIG. 12 assembled together according to one aspect of the present invention. Since the components used to assemble a package for an integrated circuit assembly of FIGS. 12 and 13 are similar, not all elements are described anew and are denoted by identical reference signs. The adhesive pre-cut tape 270 is placed on the integrated circuit 210 such that the holes 275 of the pre-cut tape are aligned with signal line pattern, here represented by silicon thru vias 260. Two layers of adhesive pre-cut tape 270 may cover both signal line areas 260 on the integrated circuit 210, although only one layer of adhesive pre-cut tape 270 is shown. In an alternative method, the die stack assembly could be built die by die on the carrier instead of attaching a preassembled die stack assembly to a chip carrier.

According to another aspect to the present invention there is a method of making a die stack assembly wherein the method includes steps as described in the following. In an initial step, a plurality of integrated circuits are provided. In another step a heat conducting intermediate layer and pre-cut tape are placed on an area of the first integrated circuit. The heat conducting intermediate layer may be placed on an area of the integrated circuit without pre-cut tape, as was shown in FIGS. 12 and 13. Next, a second integrated circuit is placed on the pre-cut tape and the heat conducting intermediate layer of the first integrated circuit. Thus far, a two integrated circuit die stack assembly has been constructed.

A third integrated circuit may be incorporated into the die stack be repeating the placing steps, i.e. placing adhesive pre-cut tape and a heat conducting intermediate layer on the second integrated circuit followed by placing a third integrated circuit on the second integrated circuit and the adhesive pre-cut tape and heat conducting layers. The previous steps may be repeated as necessary until the last integrated circuit is in place for a completed die stack assembly that may correspond to a specified quantity and/or type of integrated circuits within the die stack assembly or merely a pre-determined height that die stack assembly should be.

For an integrated circuit assembly that has a signal line pattern, the method may also include adhesive pre-cut tape having holes that match the signal line pattern and aligning the holes with the signal line pattern during the placing step of the adhesive pre-cut tape. Additionally, the method may also include an integrated circuit that is placed on the adhesive pre-cut tape and the heat conducting intermediate layer such that a signal line area of the integrated circuit aligns with the matching holes in the adhesive pre-cut tape.

In another aspect of the invention, the heat conducting intermediate layer may extend beyond the integrated circuit and is thermally coupled to the heat dissipation device. In another step, the method may comprise forming the heat dissipation device by surrounding the die stack assembly with a heat conducting encapsulant. Variations on this step include surrounding only the lateral surfaces with a heat conducting encapsulant or alternatively, surrounding only the lateral surfaces where the heat conducting layer extends beyond the integrated circuits with a heat conducting encapsulant. The embodiments illustrated in FIGS. 10 and 11 may be made according to these methods of the invention.

Aluminum, gold, copper, silver, and their alloys and carbon and carbon allotropes may be materials out of which the heat conducting intermediate layer is fabricated. Other materials are also suitable that are conventionally used for heat conduction. The thicknesses of the heat conducting intermediate layer may be between 5 and 500 micrometers. Employing thicknesses for the heat conducting intermediate layer between 0.5 and 1 times the integrated circuit thickness may also be used. The adhesive pre-cut tape thickness may also be between 5 and 500 micrometers. The thickness of the adhesive pre-cut tape may also lie within the conventional range of between 20 and 100 micrometers.

An encapsulant employed by any embodiments of the invention may comprise a heat conducting material. The encapsulant may also comprise resin, such as an epoxy based resin, filled with heat conducting material, such as carbon and carbon allotropes, like graphite/graphite flakes, and carbon nanotubes; aluminum oxide; aluminum nitride; and boron nitride. Of course other heat conducting additives are also contemplated and are within the scope of the invention.

The heat dissipation device may also be fabricated from materials such as aluminum, gold, copper, silver and their alloys and carbon and carbon allotropes. Another less conventional material that may be suitable for fabricating both the heat conducting intermediate layer and the heat dissipation device because of its high heat conductance and electrical insulating characteristics is diamond and its related species such as polycrystalline diamond.

The present invention may have particular advantages for applications where the upper most integrated circuit within a die stack assembly may not be simultaneously used as a heat discharging surface. One example of such an application is a die stack assembly that employs sensor arrays. Some examples of applications that utilize the uppermost chip for sensory array input may be found in integrated circuit packages having image sensors, pressure sensors, accelerometers, and angular rate sensors.

Moreover, the present invention is particularly useful and effective for die stack assemblies having high aspect ratios i.e. in die stacks assemblies that have a very small footprint when compared to the integrated circuit's thicknesses or to the relative overall height of the die stack assembly. In those cases, the minimal footprint coupled with the relatively larger height make heat dissipation a particular problem when only the vertical direction through the stack may be used for heat discharge. The vertical heat spreader or dissipation device may also enable the selective cooling of integrated circuits within the die stack assembly without straining or burdening the thermal dissipation of the above lying integrated circuit.

Another believed advantage of the present invention is that other external conventional heat sinks may be coupled to the heat dissipation device and as the case may be, the encapsulant. Configurations that couple the invention to external conventional heat sinks likely will multiply the effectiveness of heat discharged into the ambient surrounding and decrease the operating temperature of the package.

Yet another believed advantage of the present invention is the invention's ability to dissipate heat spikes generated with associated electrical load spikes in integrated circuits within the die stack assembly, especially load spikes in the lowermost and innermost areas of the die stack assembly. Thus the maximum temperature during load spikes may be minimized. As higher and higher frequencies are demanded of integrated circuits, more and more heat will be generated and need to be dissipated to improve electrical reliability of the integrated circuits. The present invention may enable higher and higher operating frequencies and thus increased speed of integrated circuit packages.

The present invention may be used for conventional memory modules such as SIMMs or DIMMs, especially the FBD or DDR3 type memory modules that utilize high frequencies and increased densities of integrated circuits within packages. The present invention however should not be interpreted to be limited to only memory type modules.

Other types of modules that use integrated circuit devices may also be within the scope of the invention. For example, any central processing unit or CPU type modules, microprocessor modules, graphics type modules, and even sound modules, and any of their integrated circuit devices, are within the scope of the invention. In short, any type of integrated circuit assemblies or packages of integrated circuits that require heat dissipation may utilize the invention.

The preceding description only describes advantageous exemplary embodiments of the invention. The features disclosed therein and the claims and the drawings can therefore be essential for the realization of the invention in its various embodiments both individually and in any combination. While the foregoing is directed to embodiments of the present invention other and further embodiments of this invention may be devised without departing from the basic scope of the invention. The scope of the present invention being determined by the claims that follow.

What is claimed is:

1. An integrated circuit assembly, comprising:
a die stack assembly comprising a plurality of integrated circuits placed on each other, wherein the die stack assembly is disposed on a chip carrier; and
a heat dissipation device thermally coupled to a lateral surface of the die stack assembly where the heat dissipation device has a thermal conductivity of at least 3 W/m·K, wherein the heat dissipation device comprises at least one of:
aluminum;
gold;
copper;
silver;
an alloy comprising one or more of aluminum, gold, copper and silver;
carbon; and
a carbon allotrope; and
wherein the heat dissipation device encapsulates the die stack assembly.

2. A package for an integrated circuit assembly, comprising:
a die stack assembly attached to a chip carrier where the die stack assembly comprises a plurality of integrated circuits placed on each other;
a heat dissipation device thermally coupled to a lateral surface of the die stack assembly where the heat dissipation device has a thermal conductivity of at least 3 W/m·K, and;
an encapsulant surrounding a residual surface area of the die stack assembly, the residual surface being exclusive of the lateral surface.

3. The package of claim 2 wherein the heat dissipation device is thermally coupled to a horizontal surface of the die stack assembly.

4. The package of claim 2 wherein at least one intermediate heat conducting layer between integrated circuits is thermally coupled to the heat dissipation device.

5. The package of claim 4 wherein the heat conducting layer comprises at least one of: aluminum, gold, copper, silver, and their alloys, and carbon and carbon allotropes.

6. The package of claim 4 wherein at least one heat conducting layer extends beyond the integrated circuit.

7. The package of claim 6 wherein the heat conducting material is selected from the group consisting of carbon and carbon allotropes, aluminum oxide, aluminum nitride, and boron nitride.

8. The package of claim 6 wherein the die stack defines a plurality of lateral surfaces and wherein only the plurality of lateral surfaces from which the heat conducting layer extends is surrounded by the encapsulant.

9. The package of claim 2 wherein the encapsulant forms at least a part of the heat dissipation device and surrounds the die stack assembly.

10. The package of claim 9 wherein the encapsulant comprises a heat conducting material.

11. The package of claim 9 wherein the encapsulant comprises a resin filled with a heat conducting material.

12. The package of claim 9 wherein the die stack defines a plurality of lateral surfaces and wherein only the plurality of lateral surfaces are surrounded by the encapsulant.

13. The package of claim 2 wherein the integrated circuits are electrically connected to each other.

14. The package of claim 2 wherein the lateral surface is metallized.

15. The package of claim 2 wherein the heat dissipation device has a thermal conductivity of at least 10 W/m·K.

* * * * *